United States Patent
Dighe et al.

(10) Patent No.: US 11,441,893 B2
(45) Date of Patent: Sep. 13, 2022

(54) MULTI-SPOT ANALYSIS SYSTEM WITH MULTIPLE OPTICAL PROBES

(71) Applicant: KLA-Tencor Corporation, Milpitas, CA (US)

(72) Inventors: Prasanna Dighe, San Ramon, CA (US); Dieter Mueller, Milpitas, CA (US); Dong Chen, Milpitas, CA (US); Dengpeng Chen, Singapore (SG); Steve Zamek, Sunnyvale, CA (US); Daniel Kavaldjiev, San Jose, CA (US); Alexander Buettner, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/018,355

(22) Filed: Jun. 26, 2018

(65) Prior Publication Data

US 2019/0331592 A1 Oct. 31, 2019

Related U.S. Application Data

(60) Provisional application No. 62/663,436, filed on Apr. 27, 2018.

(51) Int. Cl.
*G01B 11/06* (2006.01)
*G02B 6/36* (2006.01)

(52) U.S. Cl.
CPC ........ *G01B 11/0616* (2013.01); *G02B 6/3624* (2013.01); *G02B 6/3664* (2013.01)

(58) Field of Classification Search
CPC .. G02B 6/3616; G02B 6/3624; G02B 6/3664; G02B 6/3672; G01N 21/17

(Continued)

(56) References Cited

U.S. PATENT DOCUMENTS 830,464 A    9/1906  Swan
4,637,726 A   1/1987  Walker et al.
(Continued)

FOREIGN PATENT DOCUMENTS

WO    2005083352 A1    9/2005

OTHER PUBLICATIONS

Jin, Jonghan et al., "Thickness and refractive index measurement of a silicon wafer based on an optical comb", Optics Express, vol. 18, No. 17, Aug. 16, 2010, pp. 18339-18346.

(Continued)

*Primary Examiner* — Robert Tavlykaev
(74) *Attorney, Agent, or Firm* — Suiter Swantz pc llo

(57) ABSTRACT

A system for analyzing a sample includes an illumination source with a plurality of transmitting optical fibers optically coupled to the illumination source and a detector with a plurality of receiving optical fibers optically coupled to the detector. The system further includes a plurality of probes coupled to respective ones of the plurality of transmitting optical fibers and respective ones of the plurality of receiving optical fibers. The plurality of probes are configured to illuminate respective portions of a surface of the sample and configured to receive illumination reflected, refracted, or radiated from the respective portions of the surface of the sample. The system may further include one or more switches and/or splitters configured to optically couple respective ones of the plurality of transmitting optical fibers to the illumination source and/or configured to optically couple respective ones of the plurality of receiving optical fibers to the detector.

47 Claims, 10 Drawing Sheets

(58) Field of Classification Search
USPC .............. 385/12, 15, 16; 356/237.1, 239.7, 356/237.2–237.5
See application file for complete search history.

(56) References Cited

U.S. PATENT DOCUMENTS

| | | | | |
|---|---|---|---|---|
| 4,787,692 | A * | 11/1988 | Spanke | H04Q 11/0005 385/17 |
| 5,268,975 | A * | 12/1993 | Yoshitani | B23K 26/067 385/16 |
| 5,862,273 | A * | 1/1999 | Pelletier | G01N 21/65 356/301 |
| 6,028,666 | A * | 2/2000 | Boss | G01J 3/02 356/301 |
| 6,366,713 | B1 * | 4/2002 | Lin | H04Q 11/00 385/16 |
| 6,816,252 | B2 | 11/2004 | Schulz | |
| 6,853,447 | B2 * | 2/2005 | Goetz | B07C 5/342 356/237.1 |
| 6,891,627 | B1 * | 5/2005 | Levy | G01N 21/211 257/E21.53 |
| 6,950,196 | B2 | 9/2005 | Fielden et al. | |
| 7,468,799 | B2 | 12/2008 | de Groot et al. | |
| 7,526,354 | B2 | 4/2009 | Madriaga et al. | |
| 7,961,763 | B2 * | 6/2011 | Furman | G01N 21/95623 372/30 |
| 8,432,542 | B2 * | 4/2013 | Marple | G02B 6/32 356/301 |
| 8,698,891 | B2 | 4/2014 | Turner et al. | |
| 8,830,464 | B2 | 9/2014 | Feiler et al. | |
| 9,494,529 | B1 * | 11/2016 | Fresquet | G02B 21/0032 |
| 9,739,600 | B1 * | 8/2017 | Fresquet | G01B 11/22 |
| 9,752,992 | B2 * | 9/2017 | Horn | G01N 21/8806 |
| 2001/0049160 | A1 * | 12/2001 | Watanabe | H01L 21/67132 438/113 |
| 2004/0051879 | A1 * | 3/2004 | Schick | G01B 11/026 356/601 |
| 2006/0013544 | A1 * | 1/2006 | Bouma | G02B 6/02042 385/116 |
| 2010/0013169 | A1 * | 1/2010 | Monteen | H01L 21/6838 279/3 |
| 2010/0171956 | A1 * | 7/2010 | Sappey | G01M 15/14 356/432 |
| 2010/0208272 | A1 * | 8/2010 | Tang | G01B 9/02021 356/503 |
| 2011/0135244 | A1 * | 6/2011 | Marple | G01J 3/02 385/12 |
| 2012/0019821 | A1 * | 1/2012 | Chen | G02B 21/0032 356/303 |
| 2013/0222799 | A1 * | 8/2013 | Ashok | G01J 3/0218 356/301 |
| 2013/0244003 | A1 | 9/2013 | Jin et al. | |
| 2013/0279852 | A1 * | 10/2013 | Chang | G11B 7/1384 385/33 |
| 2014/0247447 | A1 * | 9/2014 | Angel | G01N 21/65 356/301 |
| 2015/0146193 | A1 | 5/2015 | Buczkowski | |
| 2015/0162232 | A1 * | 6/2015 | Zhao | H01L 21/67259 361/234 |
| 2015/0233841 | A1 * | 8/2015 | Bobrov | G01N 21/8806 356/237.5 |
| 2015/0256726 | A1 * | 9/2015 | Kaioka | G01B 11/26 348/360 |
| 2015/0260504 | A1 * | 9/2015 | Schonleber | G01B 9/02091 356/478 |
| 2015/0377701 | A1 * | 12/2015 | Pawluczyk | G01J 3/0243 356/301 |
| 2016/0047755 | A1 * | 2/2016 | Tsai | G02B 6/0008 356/237.4 |
| 2017/0205253 | A1 * | 7/2017 | Handerek | G01D 5/3539 |
| 2017/0268908 | A1 * | 9/2017 | DiFoggio | G01H 9/004 |
| 2017/0276615 | A1 | 9/2017 | Fresquet et al. | |
| 2018/0067058 | A1 | 3/2018 | Horn | |

OTHER PUBLICATIONS

International Search Report dated Jul. 31, 2019 for PCT/US2019/027116.

* cited by examiner

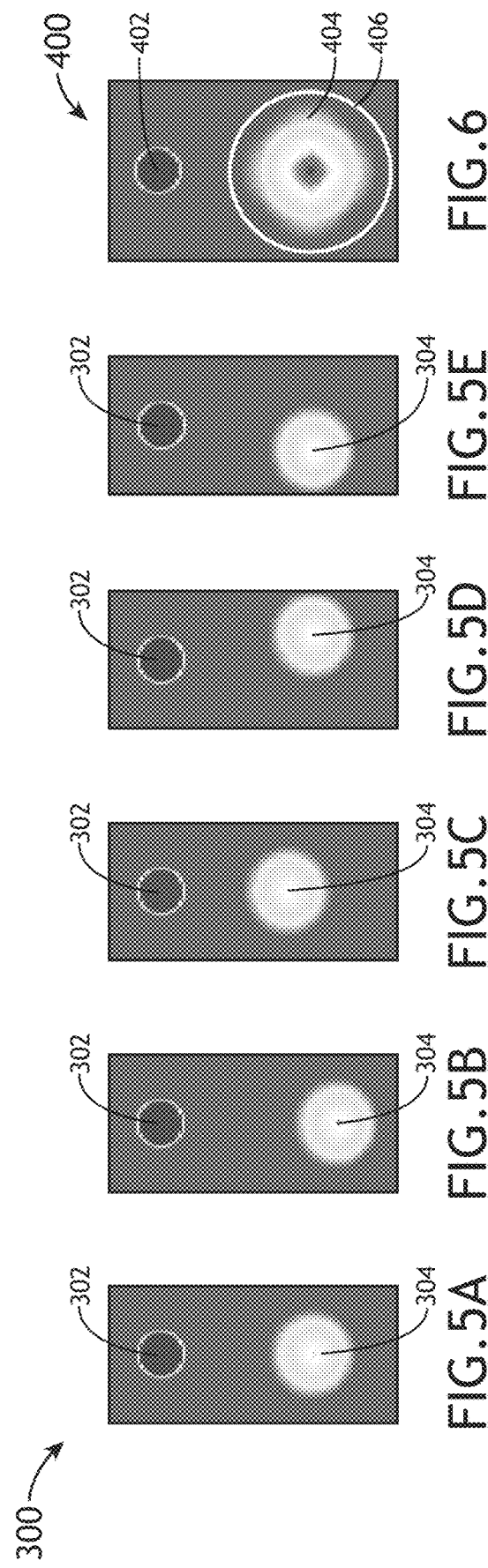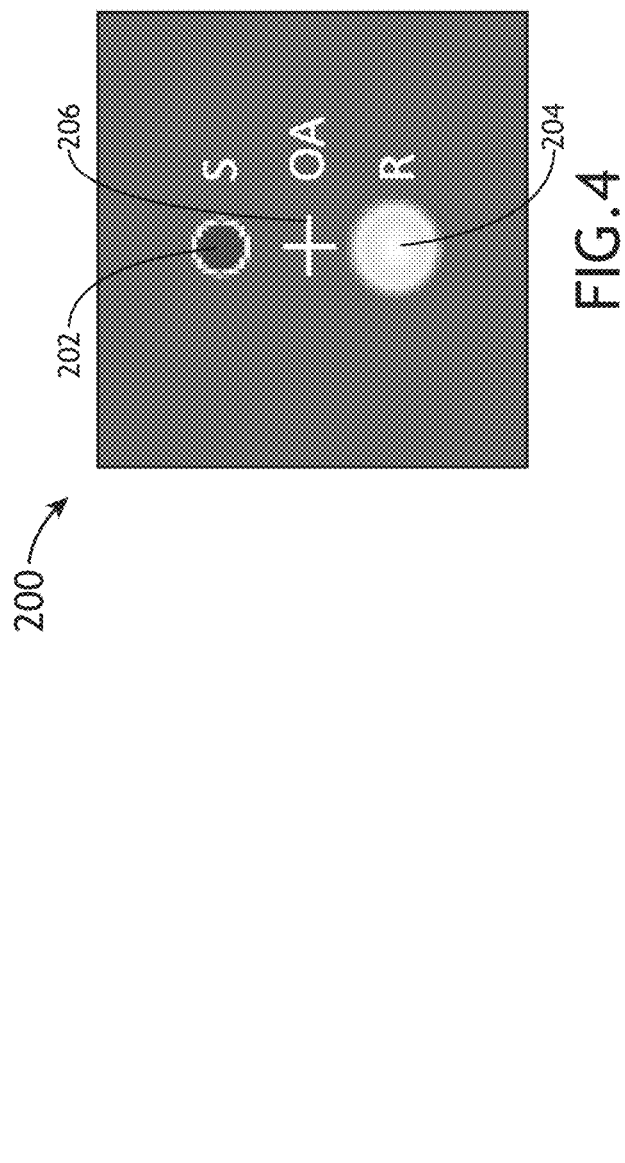

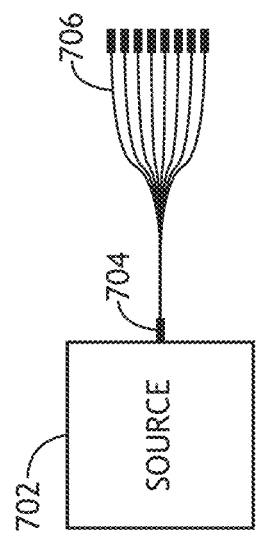
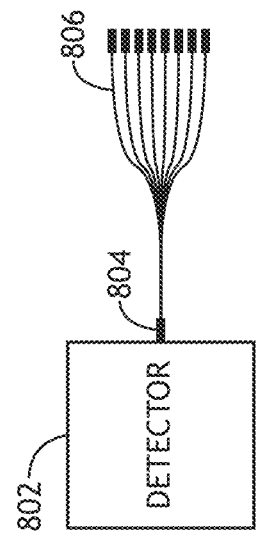
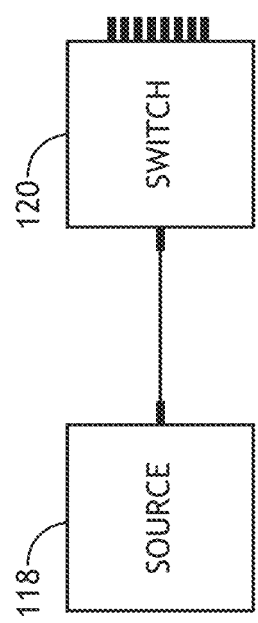
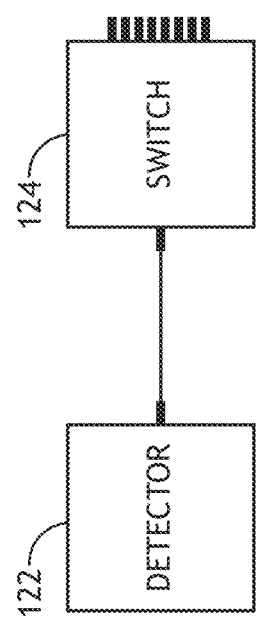

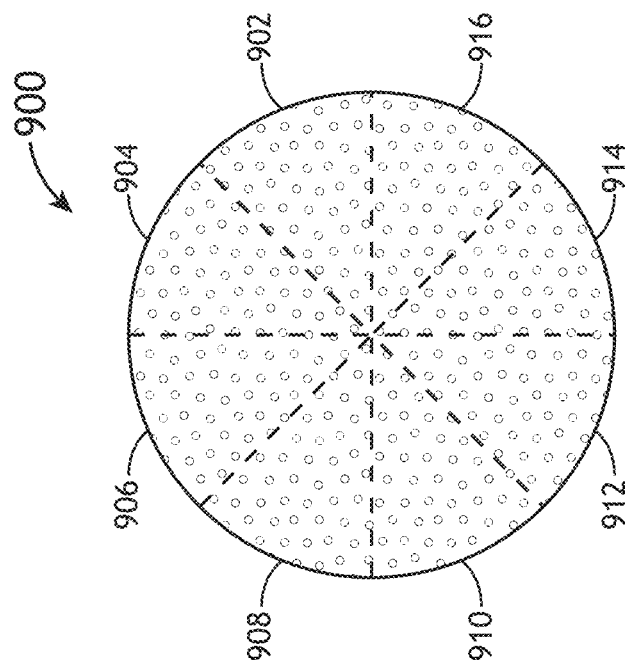
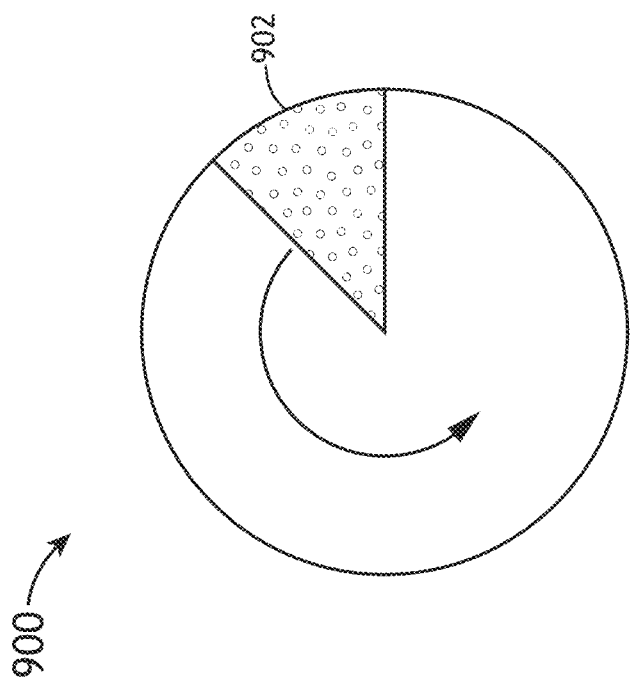
FIG. 9B
FIG. 9A

MULTI-SPOT ANALYSIS SYSTEM WITH MULTIPLE OPTICAL PROBES

CROSS-REFERENCE TO RELATED APPLICATIONS

The present application claims the benefit under 35 U.S.C. § 119(e) of U.S. Provisional Application Ser. No. 62/663,436, filed Apr. 27, 2018 and titled "MULTI-SPOT ANALYSIS SYSTEM WITH MULTIPLE OPTICAL PROBES," with inventors Prasanna Dighe, Dieter Mueller, Dong Chen, Dengpeng Chen, Steve Zamek, Daniel Kavaldjiev, and Alexander Buettner, which is incorporated herein by reference in its entirety.

TECHNICAL FIELD

The present disclosure relates generally to analysis systems and more particularly to a multi-spot analysis system with multiple optical probes.

BACKGROUND

Thin film deposition processes often yield thickness non-uniformity across a substrate (e.g., a wafer). Such non-uniformity is critical for process control in semiconductor manufacturing, as it translates to wafer yield and final device performance. It is therefore imperative to enable fast, full-wafer measurement of film thickness across the entire wafer.

Typical film thickness measurement systems include ellipsometers, reflectometers, white light interferometers, or the like. These systems employ techniques that rely on a single spot measurement. As film thickness varies across the substrate, multiple points on the substrate need to be measured. To do so, the substrate or the optics are actuated to scan the substrate point-by-point. Such systems suffer from complexity and cost, and the measurement time is limited by movement and stabilization of the substrate and/or optics. The measurement time does not scale favorably with the spatial resolution. If, for example, a twice as dense grid of points has to be measured, the number of measurement spots grows by 4. The time spent on the mechanical motion between the points and stabilization will grow proportionally. Consequently, there is a need for multi-spot measurement tools.

SUMMARY

A system for analyzing a sample with multiple probes is disclosed in accordance with one or more illustrative embodiments of the present disclosure. In one illustrative embodiment, the system includes an illumination source with a plurality of transmitting optical fibers optically coupled to the illumination source and a detector with a plurality of receiving optical fibers optically coupled to the detector. In an embodiment, the system further includes a plurality of probes coupled to respective ones of the plurality of transmitting optical fibers and respective ones of the plurality of receiving optical fibers. The plurality of probes can be configured to illuminate respective portions of a surface of the sample and to receive illumination reflected, refracted, or radiated from the respective portions of the surface of the sample.

In another illustrative embodiment, the system includes an illumination source with a first switch optically coupled to the illumination source and a detector with a second switch optically coupled to the detector. In an embodiment, the system further includes a plurality of transmitting optical fibers coupled to the first switch and a plurality of receiving optical fibers coupled to the second switch. The first switch can be configured to optically couple the illumination source to at least one transmitting optical fiber of the plurality of transmitting optical fibers. The second switch can be configured to optically couple the detector to at least one receiving optical fiber of the plurality of receiving optical fibers. In an embodiment, the system further includes a plurality of probes coupled to respective ones of the plurality of transmitting optical fibers and respective ones of the plurality of receiving optical fibers. The probes can be configured to illuminate respective portions of a surface of the sample and configured to receive illumination reflected, refracted, or radiated from the respective portions of the surface of the sample. For example, the first switch can optically couple the illumination source to at least one transmitting optical fiber of the plurality of transmitting optical fibers to illuminate at least one portion of the surface of the sample via a respective probe, and the second switch can optically couple the detector to at least one receiving optical fiber of the plurality of receiving optical fibers to receive illumination reflected, refracted, or radiated from the illuminated portion of the sample via the respective probe.

A method of analyzing a sample with multiple probes is disclosed in accordance with one or more illustrative embodiments of the present disclosure. In one illustrative implementation of the method, a sample is supported by one or more support members proximate to a plurality of probes, where the plurality of probes are coupled to respective ones of a plurality of transmitting optical fibers and respective ones of a plurality of receiving optical fibers. In an implementation of the method, an illumination source is optically coupled to at least one transmitting optical fiber of the plurality of transmitting optical fibers with a first switch to illuminate at least one portion of a surface of the sample with at least one probe that is coupled to the transmitting optical fiber and is also coupled to at least one receiving optical fiber of the plurality of receiving optical fibers. In an implementation of the method, a detector is optically coupled to the receiving optical fiber with a second switch in order to receive illumination reflected, refracted, or radiated from the portion of the surface of the sample via the probe.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4 is a schematic illustration of transmitted and received illumination by one or more probes in a system, such as the system illustrated in FIG. 1A or 1B, in accordance with one or more embodiments;

FIG. 5A is a schematic illustration of transmitted and received illumination by one or more probes in a system, such as the system illustrated in FIG. 1A or 1B, in accordance with one or more embodiments;

FIG. 5B is a schematic illustration of transmitted and received illumination by one or more probes in a system, such as the system illustrated in FIG. 1A or 1B, in accordance with one or more embodiments;

FIG. 5C is a schematic illustration of transmitted and received illumination by one or more probes in a system, such as the system illustrated in FIG. 1A or 1B, in accordance with one or more embodiments;

FIG. 5D is a schematic illustration of transmitted and received illumination by one or more probes in a system, such as the system illustrated in FIG. 1A or 1B, in accordance with one or more embodiments;

FIG. 5E is a schematic illustration of transmitted and received illumination by one or more probes in a system, such as the system illustrated in FIG. 1A or 1B, in accordance with one or more embodiments;

FIG. 6 is a schematic illustration of transmitted and received illumination by one or more probes in a system, such as the system illustrated in FIG. 1A or 1B, in relation to a probe configuration for the system, in accordance with one or more embodiments;

FIG. 7A is a schematic illustration of an illumination transmission path for a system, such as the system illustrated in FIG. 1A or 1B, in accordance with one or more embodiments;

FIG. 7B is a schematic illustration of an alternative illumination transmission path for a system, such as the system illustrated in FIG. 1A or 1B, in accordance with one or more embodiments;

FIG. 8A is a schematic illustration of an illumination collection path for a system, such as the system illustrated in FIG. 1A or 1B, in accordance with one or more embodiments;

FIG. 8B is a schematic illustration of an alternative illumination collection path for a system, such as the system illustrated in FIG. 1A or 1B, in accordance with one or more embodiments;

FIG. 9A is a schematic illustration of a multi-spot scan at one section of a sample by a system, such as the system illustrated in FIG. 1A or 1B, in accordance with one or more embodiments;

FIG. 9B is a schematic illustration of a multi-spot scan at a plurality of sections of sample by a system, such as the system illustrated in FIG. 1A or 1B, wherein the sample is rotated by one or more support members of the system in order to scan the plurality of sections of the sample, in accordance with one or more embodiments;

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Characterizing film thickness variations can be critical for process control in semiconductor manufacturing, as it translates to wafer yield and final device performance. It is therefore imperative to enable fast full-wafer measurement of film thickness across the entire wafer. Film thickness typically varies slowly across a substrate (e.g., a wafer, board, or panel). Thus, in many cases, a few measurement points are sufficient for full film thickness characterization. In other cases, the thickness may need to be monitored on select locations on the sample, where again a limited number of points may suffice. In semiconductor manufacturing, for example, films may be deposited on both sides of a substrate. Yet, the implementation of a measurement system for both front and backside surface analysis is challenging due to the intricate handling of the substrate and the fast operation required to enable high throughput.

Thickness measurement on the backside of the substrate can be applied to in-plane stress measurement and prediction of overlay errors in photo-lithography. Measurements of substrate geometry of a free, un-chucked substrate can be used in conjunction with thickness data for the film on the backside of the substrate to characterize non-uniform, stress-induced distortions. Substrate geometry data can be related to in-plane distortion of the substrate pulled flat by an exposure tool vacuum chuck, which in turn relates to overlay error.

In some systems, measurements are performed on one side of a substrate while the substrate is being held by vacuum chucking on the other side. However, such measurement techniques are not suitable for backside measurements, as chucking the substrate from the top/front side can create surface defects and surface contamination. Other techniques rely on capacitive or inductive gauges. However, those are designed for single spot measurement as well, and offer poor spatial resolution. A number of techniques were proposed to address the foregoing issues. For example, some solutions that promise to reduce the measurement time include multi-band, hyperspectral, or DMD-based imaging systems. However, these solutions require systems that are bulky, costly, and are not easily adapted to both front and back side surface measurements.

Figure 1A:
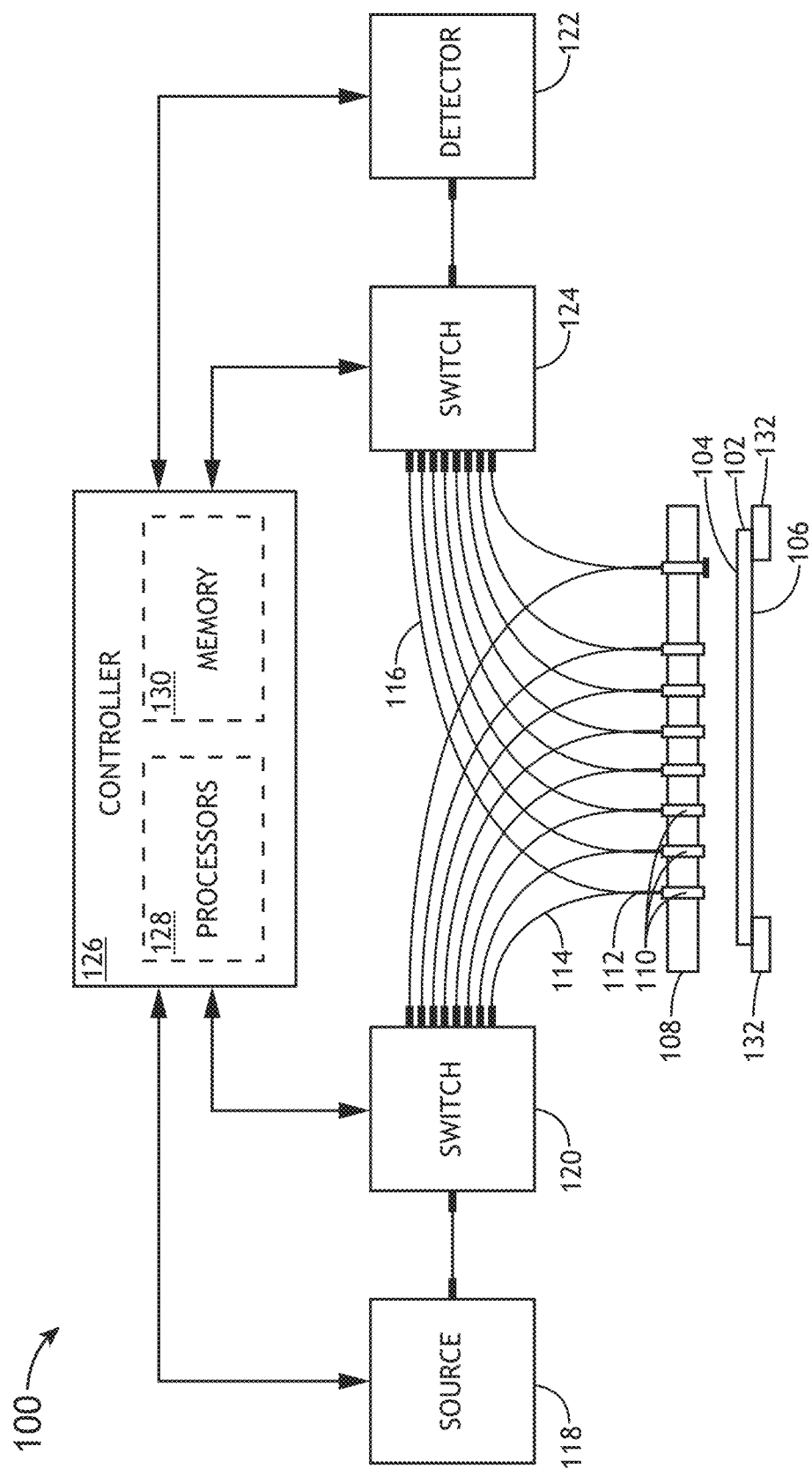
FIG. 1A is a schematic illustration of a system for analyzing a sample with multiple probes, in accordance with one or more embodiments of the present disclosure.

A system 100 for analyzing a sample with multiple probes is disclosed in accordance with one or more illustrative embodiments of the present disclosure. For example, FIG. 1A illustrates an embodiment of the system 100 configured to analyze at least a first (e.g., front/top) surface 104 of a sample 102 (e.g., a wafer, board, panel, reticle, or any other substrate). The system 100 may be a standalone system, or in some embodiments, the system 100 may be integrated (e.g., as a hardware module) within a process tool and/or as part of a multi-function analysis tool/system. For example, the system 100 may be integrated within a wafer handler for a process tool and/or as a multi-function analysis tool/system, thereby allowing for film thickness characterization in addition to other types of analysis (e.g., overlay metrology, inspection, critical dimension (CD) measurements, and so forth).

In embodiments, the system 100 includes one or more support members 132 configured to support (e.g., hold or carry) the sample 102. For example, the one or more support members 132 may include a sample stage, one or more chucks, or the like. In some embodiments, the one or more support members 132 support the sample 102 so that a backside surface 106 is at least partially exposed. For example, the one or more support members 132 may be configured to support the sample 102 without contacting the backside surface 106 of the sample 102 or by only contacting a limited portion of the backside surface 106. In an embodiment, the one or more support members 132 are configured to support the sample 102 by contacting two or more edges of the sample 102 so that all or most of the backside surface 106 of the sample 102 is left exposed. In another embodiment, the one or more support members 132 are configured to support the sample 102 by contacting a first portion (e.g., an edge or near-edge portion) of the backside surface 106 of the sample 102 so that a second portion (e.g., inner portion) of the backside surface 106 of the sample 102 is left exposed.

The system 100 includes an illumination source 118 with a plurality of transmitting optical fibers 114 optically coupled to the illumination source 118 and a detector 122 with a plurality of receiving optical fibers 116 optically coupled to the detector 122. In some embodiments, the illumination source 118 includes at least one broadband illumination source. For example, the illumination source 118 may include a discharge plasma light source (e.g., discharge plasma lamp), a laser driven or laser sustained plasma light source, and/or a supercontinuum light source (e.g., supercontinuum laser). Spectral filtering may be applied to the illumination source 118 (e.g., by one or more filter elements) to cut off shorter wavelengths and reduce the degradation of the optical fibers 114 and/or 116 over time (e.g., from solarization). In some embodiments, the detector 122 includes at least one spectrometer. In other embodiments, the detector 122 may include at least one imaging spectrometer, camera, photodiode or photodiode array, or the like.

In embodiments, the system 100 includes a first switch 120 optically coupled to the illumination source 118. The system 100 may further include a second switch 124 optically coupled to the detector 122. The transmitting optical fibers 114 may be coupled to the first switch 120, where the first switch 120 is configured to optically couple the illumination source 118 to at least one transmitting optical fiber 114 of the plurality of transmitting optical fibers 114. Similarly, the receiving optical fibers 116 may be coupled to the second switch 124, where the second switch 124 is configured to optically couple the detector 122 to at least one receiving optical fiber 116 of the plurality of receiving optical fibers 116. The first switch 120 and the second switch 124 are optical switches. For example, the first switch 120 may be a 1×M optical switch, where M is a real number greater than 2. Similarly, the second switch 124 may be a N×1 optical switch, where N is real number greater than 2. In some embodiments, M equals N. In some embodiments, the first switch 120 and/or the second switch 124 may be a multiple input, multiple output (MIMO) switch. For example, in an embodiment, the first switch 120 may be configured to optically couple respective ones of the transmitting optical fibers 114 to two or more illumination sources 118. In another embodiment, the second switch 124 may be configured to optically couple respective ones of the receiving optical fibers 116 to two or more detectors 122.

Figure 2:
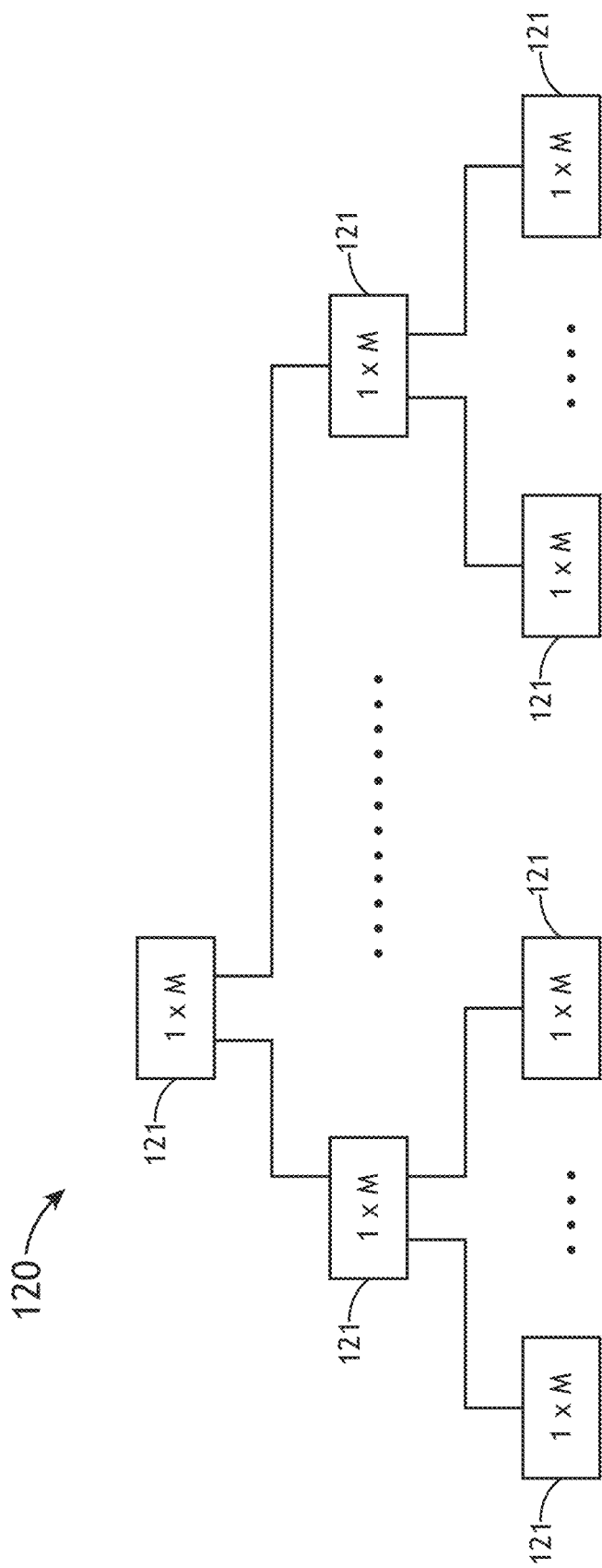
FIG. 2 is a schematic illustration of a switch configuration for a system, such as the system illustrated in FIG. 1A or 1B, in accordance with one or more embodiments.

In some embodiments, a switch (e.g., first switch 120 and/or second switch 124) can be implemented by a plurality of switches. For example, FIG. 2 illustrates an embodiment of the first switch 120 including a plurality of switches 121 that are linked together in a hierarchical configuration. In this manner, the first switch 120 can be switched by switching switches 121 simultaneously to connect one or more transmitting optical fibers 114 with the illumination source 118. By implementing the first switch 120 with a plurality of sub-switches 121, the system 100 can avoid switching delays that may otherwise occur because the sub-switches 121 can all be switched at the same time or substantially same time. For example, with a single switch based on mechanical switching between fibers, the switching time is proportional to the number of ports. Thus, for a large number of ports, the switching time may dominate the total measurement time. To reduce the measurement time, the first switch 120 can include multiple layers, each containing modular 1×M switches 121. Since all layers can switch simultaneously, the switching time for the first switch 120 will be equivalent to the switching time of a single 1×M switch 121. The second switch 124 can be implemented in a similar fashion with a plurality of sub-switches that can be switched simultaneously to connect one or more receiving optical fibers 116 with the detector 122.

Figure 1B:
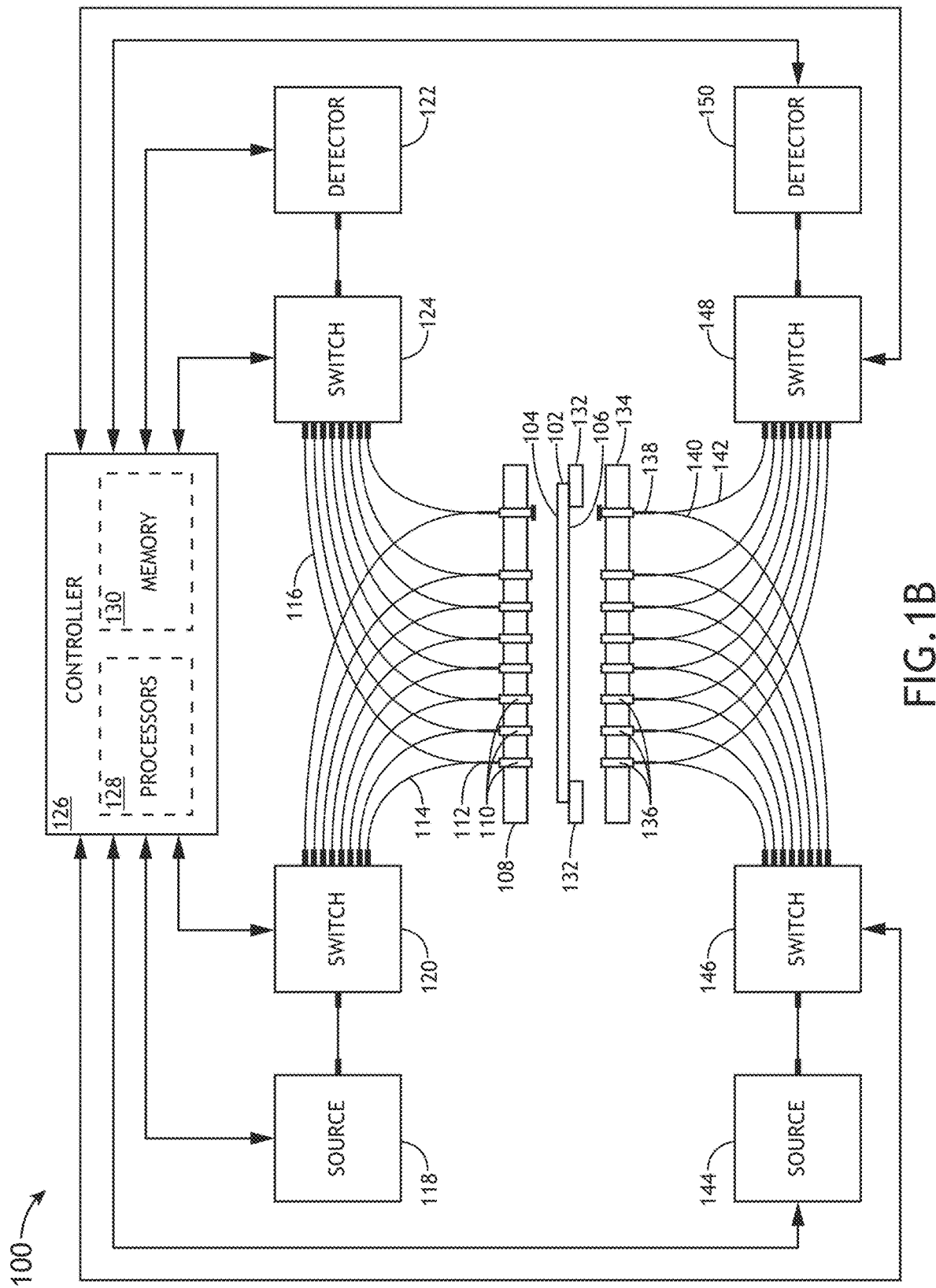
FIG. 1B is a schematic illustration of a system for analyzing a sample with multiple probes, in accordance with one or more embodiments of the present disclosure.

Referring again to FIG. 1A, in embodiments, the system 100 further includes a plurality of probes 110 coupled to respective ones of the plurality of transmitting optical fibers 114 and respective ones of the plurality of receiving optical fibers 116. For example, each probe 110 may be coupled to at least one transmitting optical fiber 114 and at least one receiving optical fiber 116. In other embodiments, one or more of the probes 110 can be coupled to at least one transmitting optical fiber 114 but not a receiving optical fiber 116, or coupled to at least one receiving optical fiber 116 but not a transmitting optical fiber 114. The system 100 may include an optics plate 108 that supports the probes 110. For example, the probes 110 can be configured in an array (e.g., linear or two-dimensional array) defined by the optics plate 108. As shown in FIG. 1A, the probes 110 can be at least partially disposed within a plurality of openings defined by the optics plate 108. In some embodiments, the probes 110 are removably coupled to the optics plate 108 to enable replacement of probe elements, to accommodate different probes 110 (e.g., with different probe elements), and/or to allow for movement of the probes 110 among different locations on the optics plate 108. The optics plate 108 may be positioned (e.g., mounted or otherwise supported) above the sample 102 (e.g., as shown in FIG. 1A) or beneath the sample 102. In some embodiments (e.g., as shown in FIG. 1B), the system 100 includes a first optics plate 108 positioned above the sample 102 and a second optics plate 134 positioned below the sample 102. Such configurations are further described herein with reference to FIG. 1B.

Figure 1C:
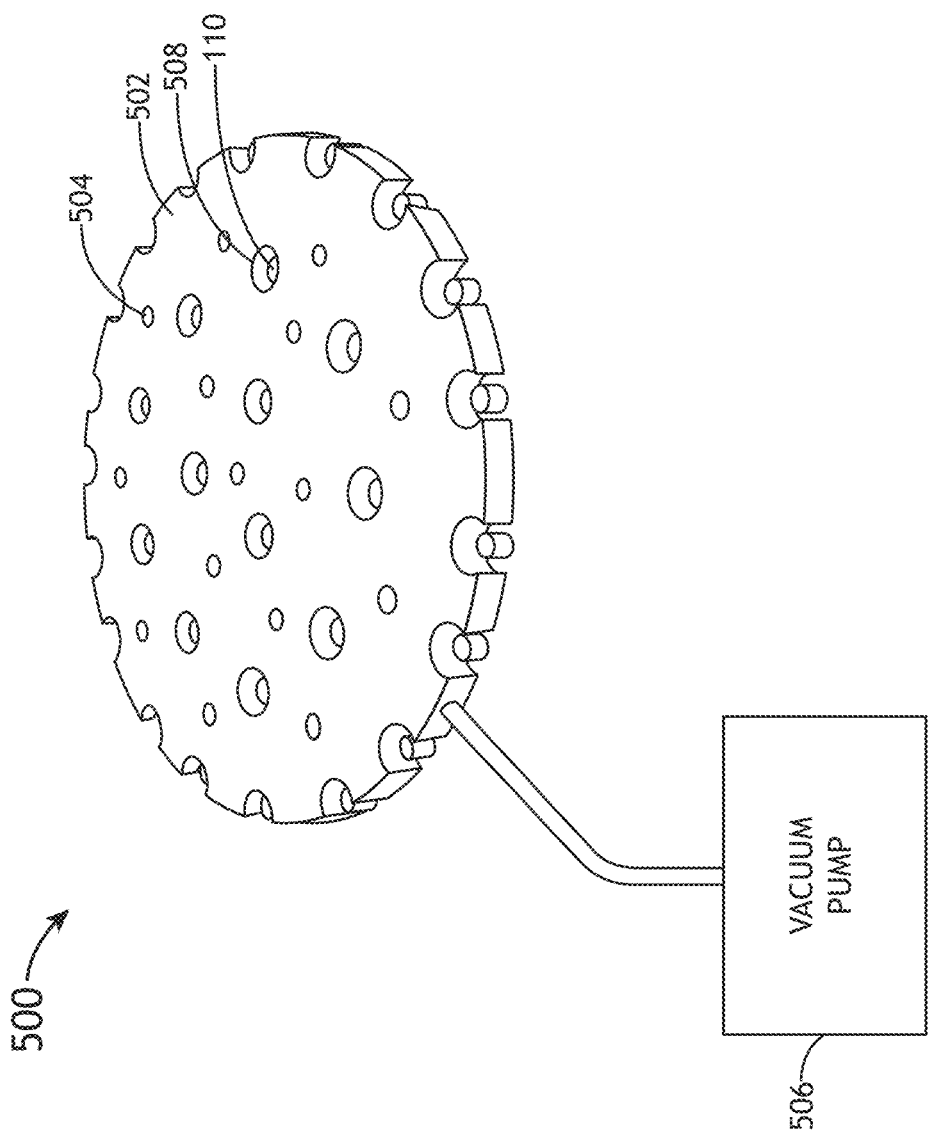
FIG. 1C is a schematic illustration of a vacuum chuck system for a system, such as the system illustrated in FIG. 1A or 1B, in accordance with one or more embodiments of the present disclosure.

In some embodiments, the optics plate 108 and the one or more support members 132 may be replaced by a vacuum chuck system, such as the vacuum chuck system 500 shown in FIG. 1C. In embodiments, the vacuum chuck system 500 includes a substrate 502 with a plurality of suction ports 504 that are fluidically coupled to a vacuum supply port. The vacuum supply port may be fluidically coupled to a vacuum pump 506 configured to suction air through the suction ports 504 so that the sample 102 can be held against the substrate 502 by a suction force. In embodiments, the substrate 502 further includes a plurality of openings 508 for the optical probes 110. In this manner, the vacuum chuck system 500 can serve as an optics plate and a support member. Some applications may require a flat wafer as wafer warp may limit the precision of film metrology accuracy. The vacuum chuck system 500 can help reduce wafer warpage and can be seamlessly integrated within the system 100 without needing to modify the design of the rest of the system 100 (i.e., other than replacement of the optics plate 108 and the one or more support members 132 by the vacuum chuck system 500). Chucking the sample 102 will keep it flat to remove effects of warp on film metrology. The vacuum chuck system 500 may also improve throughput. An un-chucked wafer will have some vibration frequency, which needs to decay before a reliable measurement can be taken. With the vacuum chuck system 500, chucking happens almost instantaneously, thereby improving the tool throughput.

Figure 3C:
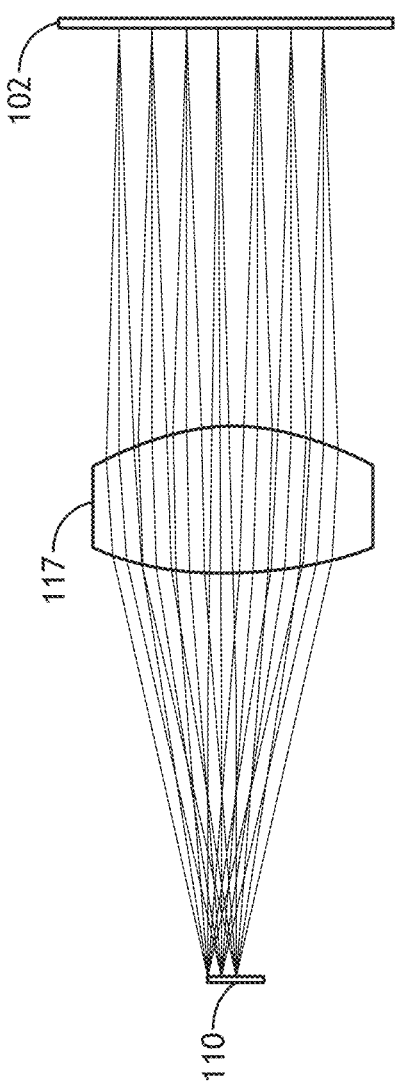
FIG. 3C is a schematic illustration of a probe configuration for a system, such as the system illustrated in FIG. 1A or 1B, in accordance with one or more embodiments.
Figure 3B:
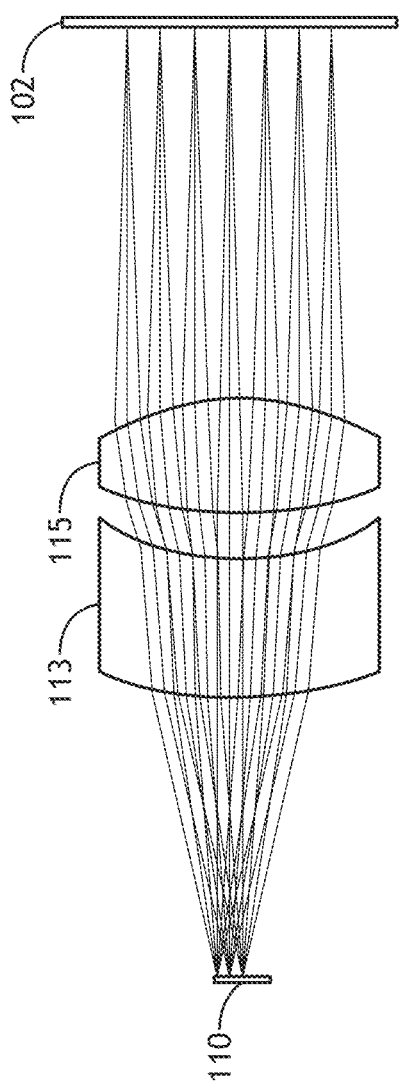
FIG. 3B is a schematic illustration of a probe configuration for a system, such as the system illustrated in FIG. 1A or 1B, in accordance with one or more embodiments.
Figure 3A:
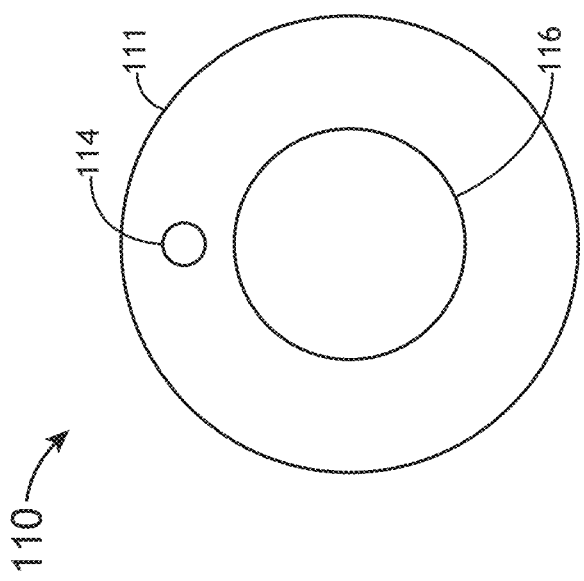
FIG. 3A is a schematic illustration of a probe configuration for a system, such as the system illustrated in FIG. 1A or 1B, in accordance with one or more embodiments.

In some embodiments, a transmitting optical fiber 114 and a receiving optical fiber 116 are coupled to a respective probe 110 by a multi-terminal (e.g., at least 3-terminal) connector 112, such as a bifurcated fiber bundle, a fan-out cable, a Y-cable, or the like. The illumination may be delivered from the source 118 to the probes 110, and from the probes 110 to the detector 122 via the multi-terminal connectors 112. For example, each multi-terminal connector 112 may include at least three terminals (e.g., a first terminal connected to a respective transmitting optical fiber 114, a second terminal connected to a respective receiving optical fiber 116, and a third terminal connected to a respective probe 110). In embodiments, the probe 110 can additionally or alternatively include a portion of the transmitting optical fiber 114 and/or a portion of the receiving optical fiber 116. For example, as shown in FIG. 3A, the probe 110 may include a housing 111 that at least partially surrounds a portion of the transmitting optical fiber 114 and a portion of the receiving optical fiber 116. In other embodiments, the housing 111 surrounds at least a portion of the multi-terminal connector 112 or optical elements (e.g., fibers, lenses, etc.) that are optically coupled to the multi-terminal connector 112.

The measurement accuracy and repeatability in connection with the geometrical properties of the sample 102 and the temporal stability of the system 100 may define the complexity of the sensor probes 110. For example, the sensor probes 110 can include autofocus and/or active tilt compensation optics and/or mechanical structures. Sample 102 warpage can affect the reflection angle of illumination from the sample 102 depending on the location and especially distance to the edge of the sample 102. The change in reflection angle, on the other hand, may change the coupling efficiency at the receiver in a wavelength-dependent matter. In this case, it can become difficult to separate out spectral changes stemming from layer thickness/index changes vs. the warpage effect. To avoid the effect of sample 102 warpage on the coupling efficiency, the probes 110 can have one or more optical elements in series with the transmitting optical fiber 114 output and/or the receiving optical fiber 116 input. For example, FIGS. 3B and 3C illustrate embodiments of the probe 110 configuration with one or more optical elements in series with the transmitting optical fiber 114 and/or the receiving optical fiber 116. In embodiments, the one or more optical elements can include, but are not limited to, a focusing lens 113, collimating lens 115, a combined purpose (e.g., collimating and focusing) lens 117, or any combination thereof. In some embodiments, the one or more optical elements are in series with the probe 110 that is coupled to and/or includes respective portions of the transmitting optical fiber 114 and the receiving optical fiber 116. For example, the probe 110 may include the one or more optical elements within its structure (e.g., within or supported by housing 111) or can be otherwise coupled to the one or more optical elements.

The probes 110 can be configured to illuminate respective portions of the surface 104 of the sample 102 (e.g., via illumination from the transmitting optical fibers 114) and configured to receive illumination reflected, refracted, or radiated from the respective portions of the surface 104 of the sample 102 (e.g., for transmission to the detector 122 via the receiving optical fibers 116). For example, the first switch 120 can optically couple the illumination source 118 to at least one transmitting optical fiber 114 to illuminate at least one portion of the surface 104 of the sample 102 via a respective one of the probes 110. Similarly, the second switch 124 can optically couple the detector 122 to at least one receiving optical fiber 116 to receive (and detect) illumination reflected, refracted, or radiated from the illuminated portion of the surface 104 the sample 102 via the respective one of the probes 110, or possibly another one of the probes 110 in close proximity to the probe 110 that illuminated the surface 104 of the sample 102. In some implementations, by illuminating the surface 104 of the sample 102 and collecting the illumination reflected, refracted, or radiated from the surface 104 of the sample 102, a reflectance spectrum can be measured for every spot (e.g., portion of the sample 102) illuminated by the probes 110. With multiple probes 110 mounted onto the optics plate 108 in a particular pattern, a set of reflectance spectra for all or most of the sample surface 104 can be measured without having to actuate the sample 102.

FIG. 4 illustrates an example of illumination intensity distribution 200 at the probe 110, including the source illumination 202 and also the reflected illumination 204. As can be seen, the source illumination 202 is off axis from an optical axis (OA) 206 of the probe 110. In some embodiments, the optical axis 206 is defined by a central axis of one or more optical elements. If the source illumination 202 is off axis, the reflected illumination 204 does not overlay the source illumination 202 but is incident on the other side of the optical axis 206. The reflected illumination 204 may be the same distance from the optical axis 206 as the source illumination 202. Such design allows for spatially separate source and reflected illumination paths, allowing the reflected illumination 204 to be collected more efficiently. The receiving optical fiber 116 can be made large enough to gather reflected illumination 204 of all wavelengths with minimal losses and can also be made small enough to reduce the etendue of the fiber. The etendue of the receiving optical fiber 116 may be selected so that it is adapted to (e.g., matches or nearly matches) the etendue of the connector 112, the switch 124, and/or the detector 122.

FIGS. 5A through 5E illustrate the effect of sample warpage on the image location at the probe 110. It can be seen that the image is shifted due to the tilt of the sample surface 104 when the probe 110 is close to the edge of the sample 102. For example, the illumination intensity distribution 300 is illustrated in FIGS. 5A through 5E for a plurality of probe 110 locations, where it can be seen that the reflected illumination 304 is shifted while the source illumination 302 stays constant. To ensure the system 100 detects illumination regardless of warpage effects, the receiving optical fiber 116 can be selected to have a diameter that is large enough to capture the shifted reflections. For example, FIG. 6 illustrates an illumination intensity distribution 400 with the different reflected illumination spots 404 overlaid relative to the source illumination 402. The receiving optical fiber 116 can be configured to have a diameter that is at least as large as the diameter of a circle 406 that covers all of the reflected illumination spots 404. In some instances, the off-axis location, delta (Δ), of the source illumination 402 in the fiber head plane corresponds to an incidence angle, alpha (α), at the wafer plane. This relationship can be characterized by the following equation: tan $$\alpha = \frac{\Delta}{\text{focal length}}.$$

Alpha (α) should not be too large in order to avoid changes in the spectral response due to different incident angle onto the wafer at different locations. From reflectivity calculations of two representative coating distributions (e.g., 100 nm or 1 μm SiO2 on top of a silicon (Si) wafer), it follows that the maximum incidence angle should be smaller than 5 degrees in order to avoid polarization effects. To improve image quality and chromatic image blurs, it may be useful to use several lenses of different glass materials at once or to even use refractive/reflective combinations or full reflective designs (e.g., Schwarzschild objective, or the like).

In alternative embodiments of the system 100, the first switch 120 that is coupled to the illumination source 118 may be replaced by a splitter or a harness with multiple fiber bundles. For example, FIGS. 7A and 7B illustrates source 118 and the first switch 120 components of the system 100 that can be replaced with an illumination source 702 having a plurality of transmitting optical fibers 706 coupled to the illumination source 702 directly or via a splitter/harness 704. While such architecture may be simpler and lower cost, it may yield lower optical signal at the sample 102, as compared with the configuration in FIG. 7A, because the configuration in FIG. 7B has the optical power equally split between a plurality of points (e.g., between the total number of transmitting optical fibers 706).

In some embodiments, the second switch 124 that is coupled to the detector 122 may also be replaced by a splitter or a harness with multiple fiber bundles. For example, FIGS. 8A and 8B illustrates the detector 122 and second switch 124 components of the system 100 that can be replaced with a detector 802 having a plurality of receiving optical fibers 806 coupled to the detector 802 directly or via a splitter/harness 804. The detector 802 may be an imaging spectrometer. For example, the detector 802 can include a Dyson spectrometer, an Offner spectrometer, or any other imaging spectrometry system. The configuration illustrated in FIG. 8B may be lower cost and capable of providing faster measurements.

In some cases, film thickness non-uniformity has fast variations across the sample 102. In such cases, significant increases in spatial resolution and the number of spots may be required. To account for this, the one or more support members 132 may be configured to actuate the sample 102. For example, the one or more support members 132 may include or can be coupled to actuators (e.g., motors, servos, linear actuators, etc.) that cause the one or more support members 132 to move the sample 102 linearly in one or more directions, or that are configured to rotate the sample 102 (e.g., clockwise or counterclockwise). In some embodiments, the system 100 alternatively or additionally includes one or more actuators that are configured to move the optics plate 108 linearly in one or more directions, or that are configured to rotate the optics plate 108 (e.g., clockwise or counterclockwise). An advantage of such design is in the tradeoffs it allows between scalability and number of channels (e.g., system complexity). For example, FIG. 9A shows a scan pattern 900 for an optics plate 108 with a plurality of probes 110 that form a section 902 (e.g., 45 degree section) of a circle. FIG. 9B illustrates a whole surface scan pattern 900 generated by rotating the sample 102 and/or the optics plate 108 (e.g., 8 successive rotations, 45 degrees each) to illuminate sections 902, 904, 906, 908, 910, 912, 914, and 916 of the circle. Choice of the number of channels/probes and geometry of the optics plate 108 may be determined based on criteria, including, but not limited to, measurement time, spatial resolution, and system complexity.

In some embodiments, for example as shown in FIG. 1B, the system 100 can be further configured to analyze the backside surface 106 of the sample 102. In such embodiments, the system 100 may further include a second illumination source 144 with a second plurality of transmitting optical fibers 140 optically coupled to the second illumination source 144 and a second detector 150 with a second plurality of receiving optical fibers 142 optically coupled to the second detector 150. The second illumination source 144 may be similar or identical to the first illumination source 118. In some embodiments, the second illumination source 144 includes at least one broadband illumination source. For example, the second illumination source 144 may include a discharge plasma light source (e.g., discharge plasma lamp), a laser driven or laser sustained plasma light source, and/or a supercontinuum light source (e.g., supercontinuum laser). Spectral filtering may be applied to the second illumination source 144 (e.g., by one or more filter elements) to cut off shorter wavelengths and reduce the degradation of optical fibers 140 and/or 142 over time (e.g., from solarization). The second detector 150 may be similar or identical to the first detector 122. In some embodiments, the second detector 150 includes at least one spectrometer. In other embodiments, the second detector 150 may include at least one imaging spectrometer, camera, photodiode or photodiode array, or the like.

In embodiments, the system 100 includes a third switch 146 optically coupled to the second illumination source 144. The system 100 may further include a fourth switch 148 optically coupled to the second detector 150. The second transmitting optical fibers 140 may be coupled to the third switch 146, where the third switch 146 is configured to optically couple the second illumination source 144 to at least one transmitting optical fiber 140 of the second plurality of transmitting optical fibers 140. Similarly, the receiving optical fibers 142 may be coupled to the fourth switch 148, where the fourth switch 148 is configured to optically couple the second detector 150 to at least one receiving optical fiber 142 of the second plurality of receiving optical fibers 142. The third switch 146 and the fourth switch 148 may be similar or identical to one or more embodiments of the first switch 120 and the second switch 124, respectively.

The system 100 may further includes a second plurality of probes 136 coupled to respective ones of the second plurality of transmitting optical fibers 140 and respective ones of the second plurality of receiving optical fibers 142. The second plurality of probes 136 may be disposed proximate to the second (backside) surface 106 of the sample 102, while the first plurality of probes 110 are disposed proximate to the first (top/front) surface 104 of the sample 102. The probes 136 may be similar or identical to one or more embodiments of the probes 110 previously described herein. In some embodiments, a transmitting optical fiber 140 and a receiving optical fiber 142 are coupled to a respective probe 136 by a multi-terminal (e.g., at least 3-terminal) connector 138, such as a bifurcated fiber bundle, a fan-out cable, a Y-cable, or the like. The illumination may be delivered from the second illumination source 144 to the probes 136, and from the probes 136 to the second detector 150 via the multi-terminal connectors 138. For example, each multi-terminal connector 138 may include at least three terminals (e.g., a first terminal connected to a respective transmitting optical fiber 140, a second terminal connected to a respective receiving optical fiber 142, and a third terminal connected to a respective probe 136). In embodiments, the probe 136 can additionally or alternatively include a portion of the transmitting optical fiber 114 and/or a portion of the receiving optical fiber 116.

The system 100 may further include an optics plate 134 that supports the probes 136. For example, the probes 136 can be configured in an array (e.g., linear or two-dimensional array) defined by the optics plate 134. The optics plate 134 can also be similar or identical to one or more embodiments of the optics plate 108 previously described herein. The optics plate 134 can be mounted below the one or more support members 132 (e.g., below the sample 102), while the other optics plate 108 is mounted above the one or more support members 132 (e.g., above the sample 102).

The probes 136 can be configured to illuminate respective portions of the backside surface 106 of the sample 102 (e.g., via illumination from the transmitting optical fibers 140) and configured to receive illumination reflected, refracted, or radiated from the respective portions of the backside surface 106 of the sample 102 (e.g., for transmission to the detector 150 via the receiving optical fibers 142). For example, the third switch 146 can optically couple the second illumination source 144 to at least one transmitting optical fiber 140 to illuminate at least one portion of the backside surface 106 of the sample 102 via a respective one of the probes 136. Similarly, the fourth switch 148 can optically couple the second detector 150 to at least one receiving optical fiber 142 to receive (and detect) illumination reflected, refracted, or radiated from the illuminated portion of the backside surface 106 the sample 102 via the respective one of the probes 136, or possibly another one of the probes 136 in close proximity to the probe 136 that illuminated the backside surface 106 of the sample 102. In some implementations, by illuminating the backside surface 106 of the sample 102 and collecting the illumination reflected, refracted, or radiated from the backside surface 106 of the sample 102, a reflectance spectrum can be measured for every spot (e.g., portion of the sample 102) illuminated by the probes 136. With multiple probes 136 mounted onto the optics plate 134 in a particular pattern, a set of reflectance spectra for all or most of the backside surface 106 can be measured without having to actuate the sample 102. Additionally, as described above, the upper probes 110 that mounted on the first optics plate 108 can measure reflectance spectra for all or most of the front/top surface 104 of the sample 102. In this regard, both sides of the sample 102 can be analyzed without having to actuate the sample 102.

Referring still to FIG. 1B, in some embodiments, the illumination sources 118 and 144 may be replaced by a single illumination source with one or more switches (e.g., first switch 120 and/or third switch 146) that are configured to optically couple the illumination source to probes 110 for analyzing the front/top surface 104 of the sample 102 and are also configured to optically couple the illumination source to probes 136 for analyzing the backside surface 106 of the sample 102. Also, in some embodiments, the detectors 122 and 150 may be replaced by a single detector with one or more switches (e.g., second switch 124 and/or fourth switch 148) that are configured to optically couple the detector to probes 110 for analyzing the front/top surface 104 of the sample 102 and are also configured to optically couple the illumination source to probes 136 for analyzing the backside surface 106 of the sample 102. In this regard, the system 100 may include any number of illumination sources, detectors, or switches.

In embodiments shown in FIG. 1A and FIG. 1B, the system 100 further includes a controller 126. In some embodiments, the controller 126 includes one or more processors 128 configured to execute program instructions maintained on a memory medium 130. In this regard, the one or more processors 128 of controller 126 may execute any of the various process steps or operations described throughout the present disclosure.

The one or more processors 128 of a controller 126 may include any processing element known in the art. In this sense, the one or more processors 128 may include any microprocessor-type device configured to execute algorithms and/or instructions. In one embodiment, the one or more processors 128 may comprise a desktop computer, mainframe computer system, workstation, image computer, parallel processor, or any other computer system (e.g., networked computer) configured to execute a program configured to operate the hybrid inspection system 100, as described throughout the present disclosure. It is further recognized that the term "processor" may be broadly defined to encompass any device having one or more processing elements, which execute program instructions from a non-transitory memory medium 130.

The memory medium 130 may include any storage medium known in the art suitable for storing program instructions executable by the associated one or more processors 128. For example, the memory medium 130 may include a non-transitory memory medium. By way of another example, the memory medium 130 may include, but is not limited to, a read-only memory, a random access memory, a magnetic or optical memory device (e.g., disk), a magnetic tape, a solid state drive and the like. It is further noted that memory medium 130 may be housed in a common controller housing with the one or more processors 128. In one embodiment, the memory medium 130 may be located remotely with respect to the physical location of the one or more processors 128 and controller 126. For instance, the one or more processors 128 of controller 126 may access a remote memory (e.g., server), accessible through a network (e.g., internet, intranet and the like). Therefore, the above description should not be interpreted as a limitation on the present invention but merely an illustration.

The controller 126 may be configured to control the first illumination source 118 and/or the second illumination source 144. For example, the controller 126 may be configured to control one or more illumination parameters (e.g., illumination intensity, wavelength, bandwidth, frequency, spot size, or the like). The controller 126 can be configured to receive data from the first detector 122 and/or the second detector 150. For example, the controller 126 may receive any combination of raw data, processed data (e.g., thickness measurements), and/or partially-processed data. Further, the steps described throughout the present disclosure may be carried out by a single controller 126 or, alternatively, multiple controllers. Additionally, the controller 126 may include one or more controllers housed in a common housing or within multiple housings. In this way, any controller or combination of controllers may be separately packaged as a module suitable for integration into the system 100. For instance, the controller 126 may operate as a centralized processing platform for the first detector 122 and/or the second detector 150 and may implement one or more analysis (e.g., measurement) algorithms to received data (raw and/or partially-processed) to determine one or more sample attributes or parameters (e.g., film height/thickness, surface uniformity/non-uniformity, etc.).

In embodiments, the controller 126 is configured to control the first switch 120, the second switch 124, the third switch 146, and/or the fourth switch 148. For example, the controller 126 can be configured to perform analysis and/or measurements for at least one portion of the sample 102 by causing a switch 120/146 to optically couple an illumination source 118/144 with a probe 110/136 in proximity to the portion of the sample 102. In this regard, the controller 126 may be configured to cause the switch 120/146 to optically couple the illumination source 118/144 to at least one transmitting optical fiber 114/140 associated with (e.g., coupled to) the probe 110/136 and configured to cause the switch 124/148 to optically couple the detector 122/150 to at least one receiving optical fiber 116/142 associated with (e.g., coupled to) the probe 110/136 (or a receiving optical fiber associated with a nearby probe).

The controller 126 may be configured to implement a spot-by-spot scan pattern on a front/top surface 104 and/or backside surface 106 of the sample 102. For example, the controller 126 can be configured to perform analysis and/or measurements for at least one other portion (e.g., next spot) of the sample 102 by causing a switch 120/146 to optically couple an illumination source 118/144 with a probe 110/136 in proximity to the other (next) portion of the sample 102. In this regard, the controller 126 may be configured to cause the switch 120/146 to optically couple the illumination source 118/144 to at least one other (next) transmitting optical fiber 114/140 associated with (e.g., coupled to) another (next) probe 110/136 and configured to cause the switch 124/148 to optically couple the detector 122/150 to at least one receiving optical fiber 116/142 associated with (e.g., coupled to) the other (next) probe 110/136.

The controller 126 may also be configured to implement a parallel, multi-spot scan pattern on a front/top surface 104 and/or backside surface 106 of the sample 102. For example, the controller 126 can be configured to perform simultaneous (or at least partially in parallel) analysis and/or measurements for two or more portions (e.g., spots) of the sample 102 by causing switch 120/146 to optically couple illumination source 118/144 with two or more probes 110/136 in proximity to the two or more portions of the sample 102. In this regard, the controller 126 may be configured to cause the switch 120/146 to optically couple the illumination source 118/144 to two or more transmitting optical fibers 114/140 associated with (e.g., coupled to) the two or more probes 110/136 and configured to cause the switch 124/148 to optically couple the detector 122/150 to two or more receiving optical fibers 116/142 associated with (e.g., coupled to) the two or more probes 110/136.

Figure 10A:
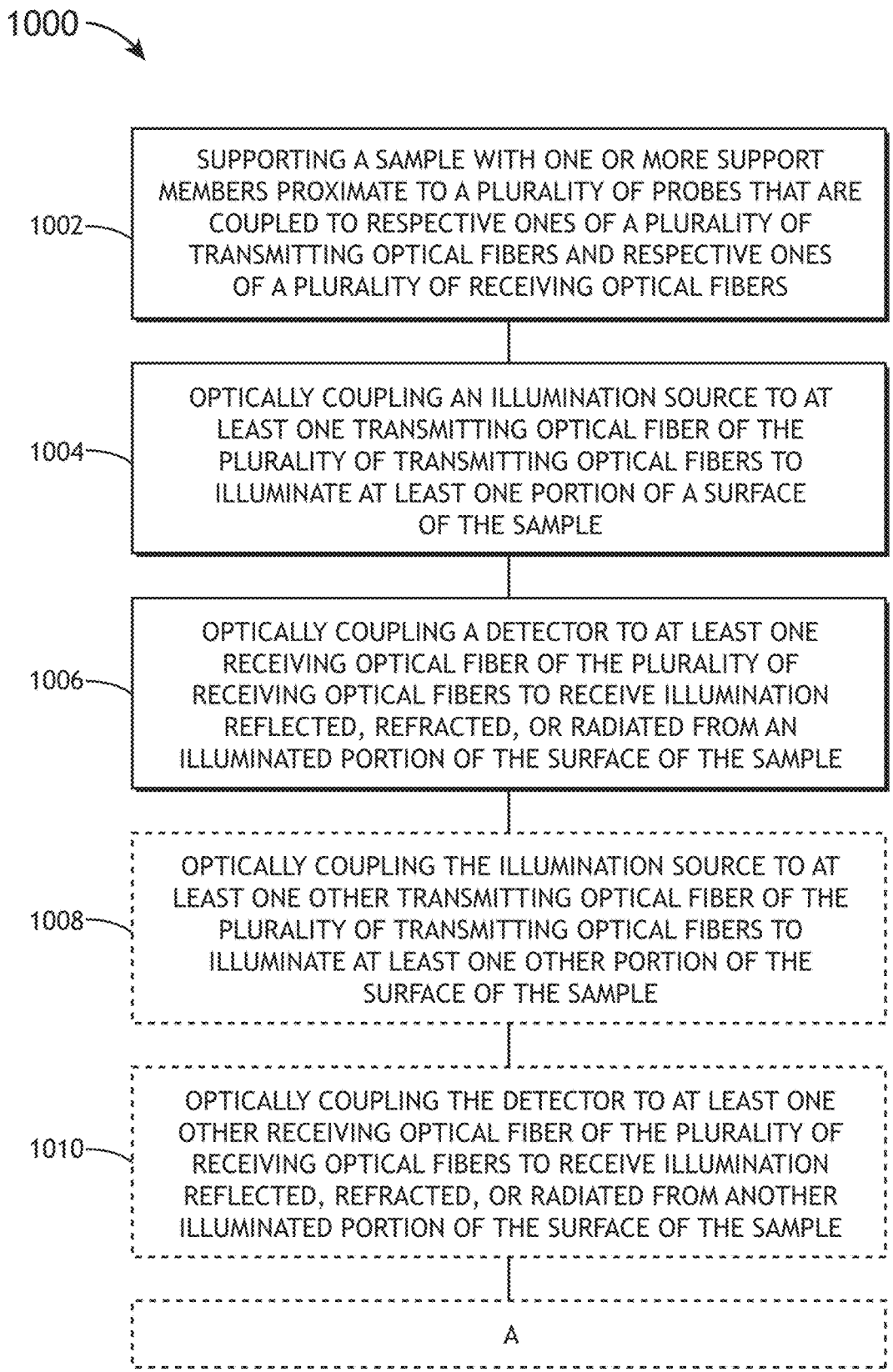
FIG. 10A is a flow diagram illustrating a method of analyzing a sample with multiple probes, in accordance with one or more implementations.
Figure 10B:
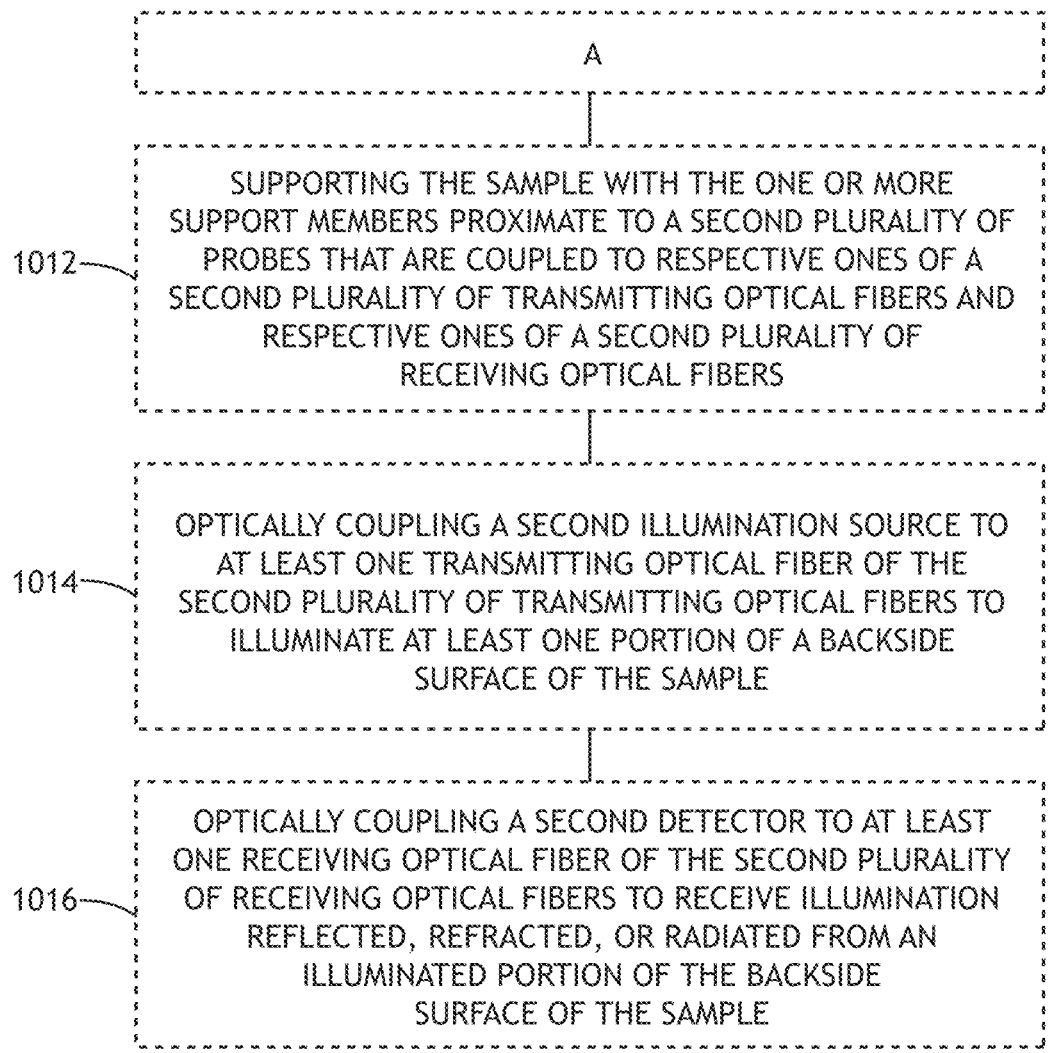
FIG. 10B is a flow diagram illustrating a method of analyzing a sample with multiple probes, in accordance with one or more implementations.

FIGS. 10A and 10B illustrate steps performed in a method 1000 of analyzing a sample with multiple probes, in accordance with one or more embodiments of the present disclosure. Applicant notes that the embodiments and enabling technologies described previously herein in the context of system 100 should be interpreted to extend to the method 1000. It is further noted, however, that the method 1000 is not limited to the architecture of system 100.

At step 1002, the method 1000 includes supporting a sample with one or more support members proximate to a plurality of probes that are coupled to respective ones of a plurality of transmitting optical fibers and respective ones of a plurality of receiving optical fibers. For example, the one or more support members 132 of the system 100 can support the sample 102 in proximity to (e.g., near) probes 110, which are coupled to respective ones of the transmitting optical fibers 114 and respective ones of the receiving optical fibers 116.

At step 1004, the method 1000 includes optically coupling an illumination source to at least one transmitting optical fiber of the plurality of transmitting optical fibers with a first switch to illuminate at least one portion of a surface of the sample. For example, the first switch 120 can be configured (automatically via controller 126 or manually) to optically couple the illumination source 118 to a transmitting optical fiber 114 that is associated with a probe 110 utilized to illuminate a portion of the surface 104 of the sample 102. The probe 110 may be further coupled to a respective one of the receiving optical fibers 116.

At step 1006, the method 1000 includes optically coupling a detector to at least one receiving optical fiber with a second switch to receive illumination reflected, refracted, or radiated from the portion of the surface of the sample. For example, the second switch 124 can be configured (automatically via controller 126 or manually) to optically couple the detector 122 to the receiving optical fiber 116 that is associated with the probe 110 utilized to illuminate the portion of the surface 104 of the sample 102, or to a receiving optical fiber 116 associated with another (nearby) probe 110.

The method 1000 may include scanning additional portions of the sample in a spot-by-spot scanning algorithm or by scanning two or more portions (spots) in parallel. For example, the method 1000 may include a step 1008 of optically coupling the illumination source to at least one other transmitting optical fiber of the plurality of transmitting optical fibers with the first switch to illuminate at least one other portion of a surface of the sample. For example, the first switch 120 can be configured (automatically via controller 126 or manually) to optically couple the illumination source 118 to another transmitting optical fiber 114 that is associated with another probe 110 utilized to illuminate another portion of the surface 104 of the sample 102. The method 1000 may further include a step 1010 of optically coupling the detector to at least one other receiving optical fiber with the second switch to receive illumination reflected, refracted, or radiated from the other portion of the surface of the sample. For example, the second switch 124 can be configured (automatically via controller 126 or manually) to optically couple the detector 122 to a receiving optical fiber 116 that is associated with the other probe 110 utilized to illuminate the other portion of the surface 104 of the sample 102, or to a receiving optical fiber 116 associated with yet another (nearby) probe 110.

In some embodiments, steps 1004 and 1008 and/or steps 1006 and 1010 may be carried out at least partially in parallel (e.g., to perform measurements at two or more portions of the sample). In other embodiments, step 1004 precedes step 1008, and step 1006 precedes step 1010 (e.g., to implement a spot-by-spot scan). In some embodiments, the sample 102 is also actuated (e.g., linearly or rotationally), or the optics plate 108/134 and probes 110/136 may be actuated (e.g., linearly or rotationally) in order to scan additional portions of the surface 104/106 of the sample 102.

In some embodiments, the method 1000 includes performing analysis (e.g., measurements) on a front/top surface 104 of the sample 102 and on a backside surface 106 of the sample 102. For example, the method 1000 may include a step 1012 of supporting the sample with the one or more support members proximate to a second plurality of probes that are coupled to respective ones of a second plurality of transmitting optical fibers and respective ones of a second plurality of receiving optical fibers. The one or more support members 132 of system 100 can support the sample 102 in proximity to (e.g., near) probes 136, which are coupled to respective ones of the transmitting optical fibers 140 and respective ones of the receiving optical fibers 142. In some embodiments, the one or more support members 132 support the sample so that a backside surface 106 is at least partially exposed. For example, the one or more support members 132 may be configured to support the sample without contacting the backside surface 106 of the sample or by only contacting a limited portion of the backside surface 106. In an embodiment, the one or more support members 132 are configured to support the sample 102 by contacting two or more edges of the sample 102 so that all or most of the backside surface 106 of the sample 102 is left exposed. In another embodiment, the one or more support members 132 are configured to support the sample 102 by contacting a first portion (e.g., an edge or near-edge portion) of the backside surface 106 of the sample 102 so that a second portion (e.g., inner portion) of the backside surface 106 of the sample 102 is left exposed.

The method 1000 may further include a step 1014 of optically coupling a second illumination source to at least one transmitting optical fiber of a second plurality of transmitting optical fibers to illuminate at least one portion of a backside surface of the sample. For example, the third switch 146 can be configured (automatically via controller 126 or manually) to optically couple the second illumination source 144 to a transmitting optical fiber 140 that is associated with a probe 136 utilized to illuminate a portion of the backside surface 106 of the sample 102. The probe 136 may be further coupled to a respective one of the receiving optical fibers 142.

The method 1000 may further include a step 1016 of optically coupling a second detector to at least one receiving optical fiber of the second plurality of receiving optical fibers to receive illumination reflected, refracted, or radiated from the portion of the backside surface of the sample. For example, the fourth switch 148 can be configured (automatically via controller 126 or manually) to optically couple the second detector 150 to the receiving optical fiber 142 that is associated with the probe 136 utilized to illuminate the portion of the backside surface 106 of the sample 102, or to a receiving optical fiber 142 associated with another (nearby) probe 136.

The system 100 and methodology 1000 described herein offers numerous advantages, some of which include the following. The system 100 and method 1000 can be used to implement a film thickness metrology module that can be easily integrated with an existing metrology, inspection or process tool's substrate handling front end (sometimes referred to as Equipment Front-End Module or EFEM). Since several locations on the sample can be sampled in a very short amount of time (e.g., as little as 5 seconds or less), the system 100 and method 1000 will have minimal impact to the throughput of the host equipment or tool. The system 100 and method 1000 may offer significant cost savings compared to a high speed moving stage for sampling various locations on a substrate. Furthermore, the system 100 and method 1000 can measure film thickness and refractive index of a film stack deposited on either front or (sometimes more importantly) the backside of the sample substrate. The number of process steps in semiconductor manufacturing where films may be deposited on the backside surface of a substrate is increasing rapidly. The system 100 and method 1000 can therefore provide critical film thickness metrology information required to implement effective process control and tool monitoring and qualification mechanisms.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for analyzing a sample, comprising:
   a metrology tool comprising:
   an illumination source;
   a first switch optically coupled to the illumination source, the first switch including a plurality of first sub-switches;
   a plurality of transmitting optical fibers coupled to the first switch, wherein the first switch is configured to optically couple the illumination source to at least one transmitting optical fiber of the plurality of transmitting optical fibers;
   a detector;
   a second switch optically coupled to the detector, the second switch including a plurality of second sub-switches;
   a plurality of receiving optical fibers coupled to the second switch, wherein the second switch is configured to optically couple the detector to at least one receiving optical fiber of the plurality of receiving optical fibers;
   a plurality of probes coupled to respective ones of the plurality of transmitting optical fibers and respective ones of the plurality of receiving optical fibers;

a plurality of multi-terminal connectors, wherein each multi-terminal connector includes at least three terminals, wherein a first terminal is connected to a respective transmitting optical fiber, a second terminal is connected to a respective receiving optical fiber, and a third terminal is connected to a respective probe, the plurality of probes configured to illuminate respective portions of a surface of the sample and configured to receive illumination from the respective portions of the surface of the sample; and one or more optical elements in series with at least one of the at least one transmitting optical fiber or the at least one receiving optical fiber, the one or more optical elements configured to provide active tilt compensation and thereby reduce an effect of sample warpage on coupling efficiency into at least one of the at least one transmitting optical fiber or the at least one receiving optical fiber.

2. The system of claim 1, wherein the at least one transmitting optical fiber and the at least one receiving optical fiber are coupled to at least one probe of the plurality of probes by at least one of a bifurcated fiber bundle, a fan-out cable, or a Y-cable.

3. The system of claim 1, wherein at least one probe of the plurality of probes includes a portion of the at least one transmitting optical fiber and a portion of the at least one receiving optical fiber.

4. The system of claim 3, wherein the at least one probe further includes a housing that at least partially surrounds the portion of the at least one transmitting optical fiber and the portion of the at least one receiving optical fiber.

5. The system of claim 1, wherein the one or more optical elements include at least one focusing lens.

6. The system of claim 1, wherein the one or more optical elements include at least one collimating lens.

7. The system of claim 1, wherein the one or more optical elements are in series with the at least one probe that is coupled to the at least one transmitting optical fiber and the at least one receiving optical fiber.

8. The system of claim 7, wherein the at least one probe includes or is coupled to the one or more optical elements.

9. The system of claim 1, wherein at least one controller is communicatively coupled to the first switch and the second switch, the at least one controller configured to analyze at least one portion of the sample by:
causing the first switch to optically couple the illumination source to at least one transmitting optical fiber of the plurality of transmitting optical fibers; and
causing the second switch to optically couple the detector to at least one receiving optical fiber of the plurality of receiving optical fibers.

10. The system of claim 9, wherein the at least one controller is configured to analyze at least one other portion of the sample by:
causing the first switch to optically couple the illumination source to at least one other transmitting optical fiber of the plurality of transmitting optical fibers; and
causing the second switch to optically couple the detector to at least one other receiving optical fiber of the plurality of receiving optical fibers, wherein the at least one other transmitting optical fiber and the at least one other receiving optical fiber are coupled to another probe of the plurality of probes.

11. The system of claim 9, wherein the at least one controller is configured to simultaneously analyze two or more portions of the sample by:
causing the first switch to optically couple the illumination source to two or more transmitting optical fibers of the plurality of transmitting optical fibers; and
causing the second switch to optically couple the detector to two or more receiving optical fibers of the plurality of receiving optical fibers, wherein the two or more transmitting optical fibers and the two or more receiving optical fibers are coupled to two or more respective probes of the plurality of probes.

12. The system of claim 1, further comprising one or more support members, wherein the one or more support members are configured to actuate the sample in one or more directions.

13. The system of claim 12, wherein the one or more support members are configured to rotate the sample clockwise or counterclockwise.

14. The system of claim 1, wherein the illumination source comprises at least one broadband illumination source.

15. The system of claim 14, wherein the at least one broadband illumination source comprises at least one of a discharge plasma light source, a laser driven plasma light source, or a supercontinuum light source.

16. The system of claim 1, wherein the detector comprises a spectrometer.

17. The system of claim 1, wherein the sample comprises at least one of a wafer, a reticle, or a panel.

18. The system of claim 1, further comprising:
a second illumination source;
a third switch optically coupled to the second illumination source;
a second plurality of transmitting optical fibers coupled to the third switch, wherein the third switch is configured to optically couple the second illumination source to a transmitting optical fiber of the second plurality of transmitting optical fibers;
a second detector;
a fourth switch optically coupled to the second detector;
a second plurality of receiving optical fibers coupled to the fourth switch, wherein the fourth switch is configured to optically couple the second detector to a receiving optical fiber of the second plurality of receiving optical fibers; and
a second plurality of probes coupled to respective ones of the second plurality of transmitting optical fibers and respective ones of the second plurality of receiving optical fibers, the second plurality of probes configured to illuminate respective portions of a backside surface of the sample and configured to receive illumination reflected, refracted, or radiated from the respective portions of the backside surface of the sample.

19. The system of claim 18, further comprising one or more support members, wherein the one or more support members are configured to support the sample by contacting two or more edges of the sample, wherein at least a portion of the backside surface of the sample is left exposed.

20. The system of claim 18, further comprising one or more support members, wherein the one or more support members are configured to support the sample by contacting a first portion of the backside surface of the sample, wherein a second portion of the backside surface of the sample is left exposed.

21. The system of claim 1, wherein the system is configured to be integrated within a wafer handler for at least one of a process tool or multi-function analysis tool.

22. A system for analyzing a sample, comprising:
a metrology tool comprising:

one or more support members configured to support the sample;
an illumination source;
a plurality of transmitting optical fibers optically coupled to the illumination source;
a detector;
a plurality of receiving optical fibers optically coupled to the detector; and
a plurality of probes coupled to respective ones of the plurality of transmitting optical fibers and respective ones of the plurality of receiving optical fibers;
a plurality of multi-terminal connectors, wherein each multi-terminal connector includes at least three terminals, wherein a first terminal is connected to a respective transmitting optical fiber, a second terminal is connected to a respective receiving optical fiber, and a third terminal is connected to a respective probe, the plurality of probes configured to illuminate respective portions of a surface of the sample and configured to receive illumination from the respective portions of the surface of the sample, wherein the one or more support members comprise a substrate with a plurality of suction ports for holding the sample against the substrate with a suction force, wherein the substrate is configured to support the plurality of probes, and wherein the plurality of suction ports are distributed across the substrate; and
one or more optical elements in series with at least one of one or more of the plurality of transmitting optical fibers or one or more of the receiving optical fibers, the one or more optical elements configured to provide active tilt compensation and thereby reduce an effect of sample warpage on coupling efficiency into at least one of one or more of the plurality of transmitting optical fibers or one or more of the receiving optical fibers.

23. The system of claim 22, further comprising:
a first splitter configured to optically couple the illumination source to the plurality of transmitting optical fibers; and
a second splitter configured to optically couple the detector to the plurality of receiving optical fibers.

24. The system of claim 22, wherein a transmitting optical fiber and a receiving optical fiber are coupled to a respective probe of the plurality of probes by at least one of a bifurcated fiber bundle, a fan-out cable, or a Y-cable.

25. The system of claim 22, wherein at least one probe includes a portion of a transmitting optical fiber and a portion of a receiving optical fiber.

26. The system of claim 25, wherein the at least one probe further includes a housing that at least partially surrounds the portion of the transmitting optical fiber and the portion of the receiving optical fiber.

27. The system of claim 22, wherein the one or more optical elements include at least one focusing lens.

28. The system of claim 22, wherein the one or more optical elements include at least one collimating lens.

29. The system of claim 22, wherein at least one probe includes or is coupled to the one or more optical elements.

30. The system of claim 22, wherein the one or more support members are configured to actuate the sample in one or more directions.

31. The system of claim 22, wherein the one or more support members are configured to rotate the sample clockwise or counterclockwise.

32. The system of claim 22, wherein the illumination source comprises at least one broadband illumination source.

33. The system of claim 32, wherein the at least one broadband illumination source comprises at least one of a discharge plasma light source, a laser driven plasma light source, or a supercontinuum light source.

34. The system of claim 22, wherein the detector comprises a spectrometer.

35. The system of claim 34, wherein the spectrometer comprises an imaging spectrometer.

36. The system of claim 22, wherein the sample comprises at least one of a wafer, a reticle, or a panel.

37. The system of claim 22, further comprising:
a second illumination source;
a second plurality of transmitting optical fibers optically coupled to the second illumination source;
a second detector;
a second plurality of receiving optical fibers optically coupled to the second detector; and
a second plurality of probes coupled to respective ones of the second plurality of transmitting optical fibers and respective ones of the second plurality of receiving optical fibers, the second plurality of probes configured to illuminate respective portions of a backside surface of the sample and configured to receive illumination reflected, refracted, or radiated from the respective portions of the backside surface of the sample.

38. The system of claim 37, wherein the one or more support members are configured to support the sample by contacting two or more edges of the sample, wherein at least a portion of the backside surface of the sample is left exposed.

39. The system of claim 37, wherein the one or more support members are configured to support the sample by contacting a first portion of the backside surface of the sample, wherein a second portion of the backside surface of the sample is left exposed.

40. The system of claim 22, wherein the system is configured to be integrated within a wafer handler for at least one of a process tool or multi-function analysis tool.

41. A method of analyzing a sample, comprising:
providing a metrology tool integrated with a wafer handler of an inspection tool;
supporting, with the metrology tool, a sample with one or more support members proximate to a plurality of probes, the plurality of probes coupled to respective ones of a plurality of transmitting optical fibers and respective ones of a plurality of receiving optical fibers;
optically coupling an illumination source to at least one transmitting optical fiber of the plurality of transmitting optical fibers with a first switch to illuminate at least one portion of a surface of the sample with at least one probe that is coupled to the at least one transmitting optical fiber, the at least one probe being further coupled to at least one receiving optical fiber of the plurality of receiving optical fibers, the first switch including a plurality of first sub-switches linked together in a hierarchical configuration; and
optically coupling a detector to the at least one receiving optical fiber with a second switch to receive illumination from the at least one portion of the surface of the sample via the at least one probe, the second switch including a plurality of second sub-switches linked together in a hierarchical configuration;
providing active tilt compensation, with one or more optical elements in series with at least one of the one or more of the plurality of transmitting optical fibers or one or more of the receiving optical fibers, to reduce an effect of sample warpage on coupling efficiency into at least one of the one or more of the plurality of transmitting optical fibers or one or more of the receiving optical fibers;

acquiring, with the detector, optical measurement data from at least some of the plurality of the receiving optical fibers; and determining a variation in thickness of a film across the sample, wherein the film is deposited on at least one of a front surface or a bottom surface of the sample.

42. The method of claim 41, further comprising:

optically coupling the illumination source to at least one other transmitting optical fiber of the plurality of transmitting optical fibers with the first switch to illuminate at least one other portion of the surface of the sample with at least one other probe that is coupled to the at least one other transmitting optical fiber, the at least one other probe being further coupled to at least one other receiving optical fiber of the plurality of receiving optical fibers; and optically coupling the detector to the at least one other receiving optical fiber with the second switch to receive illumination reflected, refracted, or radiated from the at least one other portion of the surface of the sample via the at least one other probe.

43. The method of claim 41, further comprising:
actuating the sample in one or more directions.

44. The method of claim 41, further comprising:
rotating the sample clockwise or counterclockwise.

45. The method of claim 41, further comprising:
supporting the sample with the one or more support members proximate to a second plurality of probes, the second plurality of probes coupled to respective ones of a second plurality of transmitting optical fibers and respective ones of a second plurality of receiving optical fibers;

optically coupling a second illumination source to at least one transmitting optical fiber of the second plurality of transmitting optical fibers with a third switch to illuminate at least one portion of a backside surface of the sample with at least one probe of the second plurality of probes that is coupled to the at least one transmitting optical fiber of the second plurality of transmitting optical fibers, the at least one probe being further coupled to at least one receiving optical fiber of the second plurality of receiving optical fibers; and optically coupling a second detector to the at least one receiving optical fiber of the second plurality of receiving optical fibers with a fourth switch to receive illumination reflected, refracted, or radiated from the at least one portion of the backside surface of the sample via the at least one probe of the second plurality of probes.

46. The method of claim 45, wherein the one or more support members contact two or more edges of the sample, and at least a portion of the backside surface of the sample is left exposed.

47. The method of claim 45, wherein the one or more support members contact a first portion of the backside surface of the sample, and a second portion of the backside surface of the sample is left exposed.

* * * * *